(12) United States Patent
Choi

(10) Patent No.: US 8,120,393 B2
(45) Date of Patent: Feb. 21, 2012

(54) SEMICONDUCTOR MEMORY APPARATUS

(75) Inventor: Young-Kyoung Choi, Ichon (KR)

(73) Assignee: Hynix Semiconductor Inc. (KR)

( * ) Notice: Subject to any disclaimer, the term of this patent is extended or adjusted under 35 U.S.C. 154(b) by 108 days.

(21) Appl. No.: 12/347,080

(22) Filed: Dec. 31, 2008

(65) Prior Publication Data

US 2010/0073042 A1  Mar. 25, 2010

(30) Foreign Application Priority Data

Sep. 25, 2008 (KR) .......................... 10-2008-0094073

(51) Int. Cl.
*H03L 7/00* (2006.01)

(52) U.S. Cl. ......... 327/142; 327/143; 327/535; 327/538

(58) Field of Classification Search .................. 327/142, 327/143, 198, 530, 538–543, 546; 323/312–317
See application file for complete search history.

(56) References Cited

U.S. PATENT DOCUMENTS

| | | | |
|---|---|---|---|
| 5,898,635 A | 4/1999 | Raad et al. | |
| 5,936,443 A * | 8/1999 | Yasuda et al. | 327/143 |
| 6,104,221 A * | 8/2000 | Hoon | 327/143 |
| 6,236,249 B1 * | 5/2001 | Choi et al. | 327/143 |
| 6,262,608 B1 * | 7/2001 | O'Hearcain et al. | 327/142 |
| 6,275,079 B1 * | 8/2001 | Park | 327/143 |
| 6,577,166 B2 * | 6/2003 | Lim | 327/77 |
| 7,123,062 B2 | 10/2006 | Do | |
| 7,193,907 B2 * | 3/2007 | Nakatake et al. | 365/189.09 |
| 7,245,166 B2 * | 7/2007 | Kurachi et al. | 327/198 |
| 2001/0045848 A1 | 11/2001 | Stephens, Jr. | |
| 2003/0218497 A1 * | 11/2003 | Ikehashi et al. | 327/541 |
| 2004/0217804 A1 * | 11/2004 | Moon et al. | 327/540 |
| 2005/0073356 A1 * | 4/2005 | Won | 327/541 |
| 2005/0206440 A1 * | 9/2005 | Do | 327/536 |
| 2006/0164136 A1 * | 7/2006 | Shin | 327/143 |
| 2007/0069805 A1 * | 3/2007 | Choi et al. | 327/536 |
| 2007/0236278 A1 * | 10/2007 | Hur et al. | 327/536 |
| 2008/0018384 A1 * | 1/2008 | Kim et al. | 327/536 |
| 2008/0018387 A1 * | 1/2008 | Ryu et al. | 327/541 |
| 2008/0157856 A1 * | 7/2008 | Lee | 327/536 |
| 2009/0160533 A1 * | 6/2009 | Lee | 327/536 |

FOREIGN PATENT DOCUMENTS

| | | |
|---|---|---|
| KR | 1020010081400 A | 8/2001 |
| KR | 1020030059447 A | 7/2003 |

* cited by examiner

*Primary Examiner* — Lincoln Donovan
*Assistant Examiner* — Brandon S Cole
(74) *Attorney, Agent, or Firm* — Baker & McKenzie LLP

(57) ABSTRACT

A semiconductor memory apparatus includes a initialization signal generating unit configured to vary a voltage level of an external voltage in response to a detection signal, the external voltage enables a power-up signal, an internal voltage generating unit configured to produce an internal voltage, the internal voltage generating unit is initialized by the power-up signal, and a detection signal generating unit configured to produce the detection signal in response to a voltage level of the internal voltage.

14 Claims, 6 Drawing Sheets

SEMICONDUCTOR MEMORY APPARATUS

CROSS-REFERENCES TO RELATED APPLICATION

The present application claims priority under 35 U.S.C. 119(a) to Korean application number 10-2008-0094073, filed on Sep. 25, 2008, in the Korean Intellectual Property Office, which is incorporated herein by reference in its entirety as if set forth in full.

BACKGROUND

1. Technical Field

The embodiments described herein relate to a semiconductor integrated circuit, and more particularly, to a semiconductor memory apparatus.

2. Related Art

In general, a semiconductor memory apparatus uses an internal voltage that is internally produced, as well as an external voltage supplied from an external circuit. There are many advantages in using the internal voltage including achieving a stable operation by obtaining a stable voltage regardless of the external voltage and reducing current consumption.

FIG. 1 is a block diagram of a conventional semiconductor memory apparatus. In FIG. 1, a semiconductor memory apparatus 1 includes a power-up signal generator 10 and an internal voltage generator 20. The power-up signal generator 10 produces a power-up signal 'pwrup' that is enabled at a specific voltage level of the external voltage when the external voltage is supplied to the semiconductor memory apparatus 1.

The internal voltage generator 20 is initialized by the power-up signal 'pwrup' and produces an internal voltage 'V_in' of a target level when the power-up signal 'pwrup' is enabled. Here, the internal voltage generator 20 cannot produce the internal voltage 'V_in' of the target level if it is not sufficiently initialized. For example, when the internal voltage generator 20 is not sufficiently initialized and the power-up signal 'pwrup' is enabled, the internal voltage generator 20 cannot produce the internal voltage 'V_in', which has the target level. This problem is frequently caused when the enable timing of the power-up signal 'pwrup' is varied according to the variation of process, voltage, and temperature (PVT) variable in the power-up signal generator 10.

SUMMARY

A semiconductor memory apparatus capable of securing a stable operation of an initialization operation of an internal voltage generating unit in response to a power-up signal is described herein.

In one aspect, a semiconductor memory apparatus includes an initialization signal generating unit configured to vary a voltage level of an external voltage in response to a detection signal, the external voltage enables a power-up signal, an internal voltage generating unit configured to produce an internal voltage, the internal voltage generating unit is initialized by the power-up signal, and a detection signal generating unit configured to produce the detection signal in response to a voltage level of the internal voltage.

In another aspect, a semiconductor memory apparatus includes an initialization signal generating unit configured to produce an initialization signal in response to a power-up signal and a voltage level of an internal voltage, and an internal voltage generating unit configured to produce the internal voltage, wherein the internal voltage generating unit is initialized by the initialization signal.

These and other features, aspects, and embodiments are described below in the section entitled "Detailed Description."

BRIEF DESCRIPTION OF THE DRAWINGS

Aspects, features, and embodiment are described in conjunction with the attached drawings, in which.

DETAILED DESCRIPTION

Figure 1:
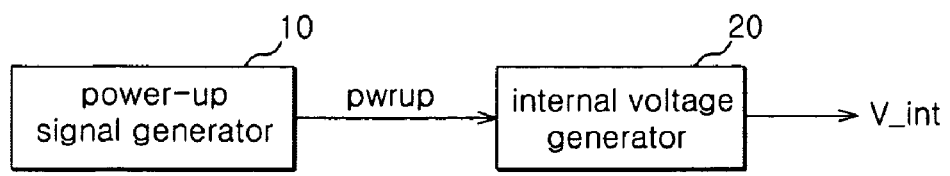
FIG. 1 is a block diagram of a conventional semiconductor memory apparatus.
Figure 2:
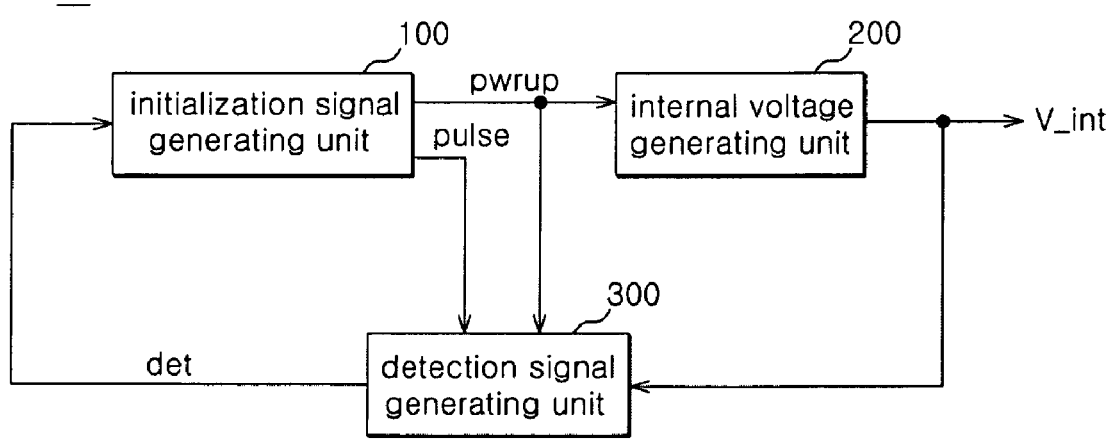
FIG. 2 is a block diagram of an exemplary semiconductor memory apparatus according to one embodiment.

FIG. 2 is a block diagram of an exemplary semiconductor memory apparatus according to one embodiment. In FIG. 2, a semiconductor memory apparatus 2 can be configured to include an initialization signal generating unit 100, an internal voltage generating unit 200, and a detection signal generating unit 300.

The initialization signal generating unit 100 can enable a power-up signal 'pwrup' when a detection signal 'det' is disabled and an external voltage is higher than a first voltage. In addition, the initialization signal generating unit 100 can enable a power-up signal 'pwrup' when the detection signal 'det' is enabled and the external voltage is higher than a second voltage. When the detection signal 'det' is disabled, the initialization signal generating unit 100 can disable the power-up signal 'pwrup' when the external voltage is lower than the first voltage. When the detection signal 'det' is enabled, the initialization signal generating unit 100 can disable the power-up signal 'pwrup' when the external voltage is lower than the second voltage. Here, the voltage level of the first voltage can be lower than the voltage level of the second voltage. In addition, the initialization signal generating unit 100 can further include a pulse generating unit to produce a pulse signal when the power-up signal 'pwrup' is enabled.

The internal voltage generating unit 200 can be initialized in response to the power-up signal 'pwrup', and can produce an internal voltage 'V_int'.

The detection signal generating unit 300 can produce the detection signal 'det' in response to a voltage level of the internal voltage 'V_int'. For example, the detection signal generating unit 300 can produce the detection signal 'det' by detecting the voltage level of the internal voltage 'V_int' for a predetermined time when the power-up signal 'pwrup' is enabled. Accordingly, the detection signal generating unit 300 can enable the detection signal 'det' when the internal voltage 'V_int' is lower than a target voltage.

Figure 3:
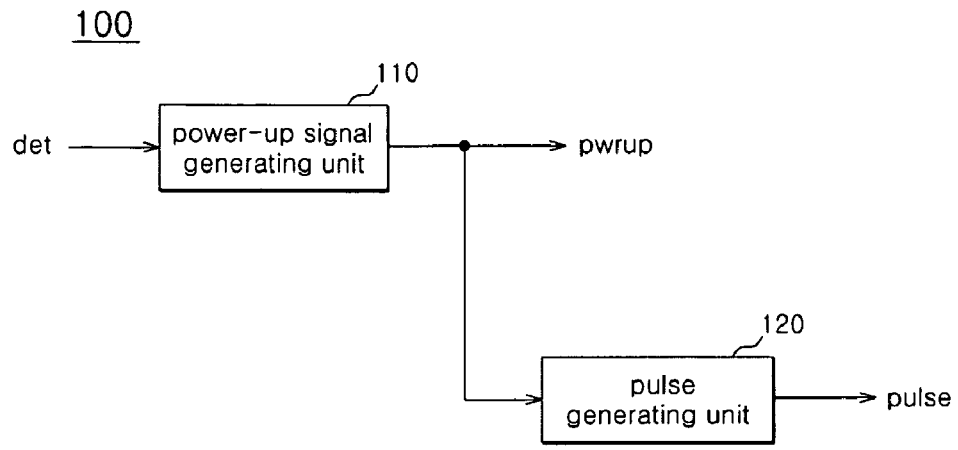
FIG. 3 is a block diagram of an exemplary initialization signal generating unit capable of being implemented in the apparatus FIG. 2 according to one embodiment.

FIG. 3 is a block diagram of an exemplary initialization signal generating unit 100 capable of being implemented in the apparatus FIG. 2 according to one embodiment. In FIG. 3, the initialization signal generating unit 100 can include a power-up signal generating unit 110 and a pulse generating unit 120.

The power-up signal generating unit 110 can enable the power-up signal 'pwrup' when the detection signal 'det' is disabled and the external voltage is higher than the first voltage. In addition, the power-up signal generating unit 110 can enable the power-up signal 'pwrup' when the detection signal 'det' is enabled and the external voltage is higher than the second voltage. When the detection signal 'det' is disabled, the power-up signal generating unit 110 can disable the power-up signal 'pwrup' when the external voltage is lower than the first voltage. When the detection signal 'det' is enabled, the power-up signal generating unit 110 can disable the power-up signal 'pwrup' when the external voltage is lower than the second voltage.

The pulse generating unit 120 can produce a pulse signal 'pulse' when the power-up signal 'pwrup' is enabled.

Figure 4:
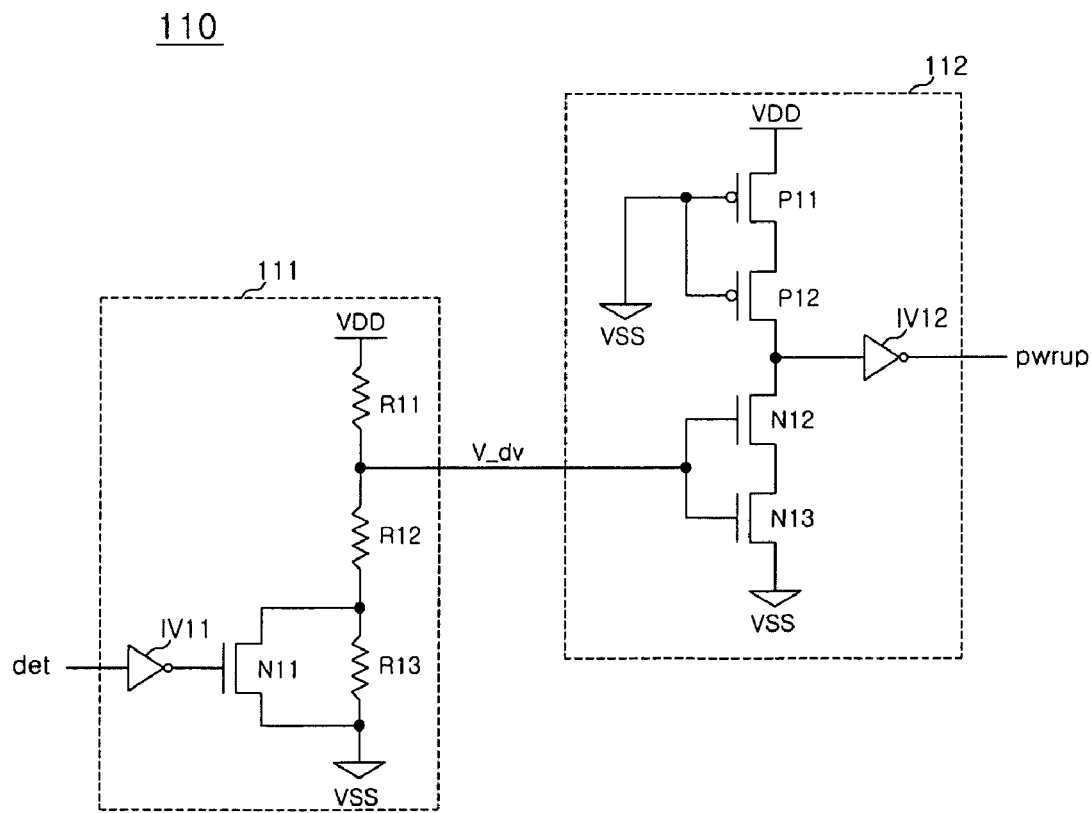
FIG. 4 is a block diagram of an exemplary power-up signal generating unit capable of being implemented in the unit of FIG. 3 according to one embodiment.

FIG. 4 is a block diagram of an exemplary power-up signal generating unit 110 capable of being implemented in the unit of FIG. 3 according to one embodiment. In FIG. 4, the power-up signal generating unit 110 can include a variable voltage dividing unit 111 and a signal generating unit 112.

The variable voltage dividing unit 111 can vary a voltage division rate in response to the detection signal 'det', and can produce a divided voltage 'V_dv' by dividing an external voltage 'VDD' based on the voltage division rate The variable voltage dividing unit 111 can include first to third resistor elements R11 to R13, a first transistor N11, and a first inverter IV11. The first to third resistor elements R11 to R13 can be coupled to each other in series. The external voltage 'VDD' can be supplied to one end of the first resister element R11 and a ground voltage 'VSS' can be supplied to one end of the third resistor element R13.

In FIG. 4, the first inverter IV11 can receive the detection signal 'det'. In addition, the first transistor N11 can include a gate terminal receiving an output signal of the first inverter IV11, a source terminal coupled to one end of the third resistor element R13, and a drain terminal coupled to the other end of the third resistor element R13. Here, a division voltage 'V_d' can be produced at a connection node between the first resistor element R11 and the second resistor element R12.

The rate of the voltage division 'V_d' in the variable voltage dividing unit 111 can be determined in response to the detection signal 'det'. When the variable voltage dividing unit 111 is configured to reduce the voltage division rate in response to the detection signal 'det' that is enabled at a low level, the first inverter IV11 can be removed from the variable voltage dividing unit 111.

An exemplary operation of the variable voltage dividing unit 111 will be described with reference to FIG. 4. Here, it may be presumed that the first to third resistor elements R11 to R13 can have substantially the same resistance values.

When the detection signal 'det' is disabled at a high level, the first transistor N11 can be turned OFF. If the first transistor N11 is turned OFF, then current can flow through the first to third resistor elements R11 to R13, and the voltage level of the division voltage 'V_d' can be about two-third of the external voltage 'VDD'.

When the detection signal 'det' is enabled, the first transistor N11 can be turned ON. If the first transistor N11 is turned ON, then current can flow through the first and second resistor elements R11 and R12 and the first transistor N11, and the voltage level of the division voltage 'V_d' can be about one-half of the external voltage 'VDD'. As a result, the variable voltage dividing unit 111 can vary the voltage level of the division voltage 'V_d' in response to the detection signal 'det'. The variation of the division voltage 'V_d' can be caused by the connection between the first transistor N11 and the third resistor element R13. Thus, both the first transistor N11 and the third resistor element R13 can function as a variable resistor.

The signal generating unit 112 can enable the power-up signal 'pwrup' at a high level when the division voltage 'V_d' is higher than a specific voltage level. For example, the signal generating unit 112 can include second to fifth transistors P11, P12, N12 and N13, and a second inverter IV12.

The second transistor P11 can have a gate terminal coupled to the ground voltage 'VSS' and a source terminal receiving the external voltage 'VCDD'. The third transistor P12 can include a gate terminal coupled to the ground voltage 'VSS' and a source terminal coupled to a drain of the second transistor P11. The fourth transistor N12 can include a gate terminal receiving the division voltage 'V_d' and a drain terminal coupled to a drain of the third transistor P12. The fifth transistor N13 can include a gate terminal receiving the division voltage 'V_d', a drain terminal coupled to a source of the fourth transistor N12, and a source terminal coupled to the ground voltage 'VSS'. The second inverter can output the power-up signal 'pwrup' by inverting a voltage on a node between the third transistor P12 and the fourth transistor N12.

The signal generating unit 112 can produce the power-up signal 'pwrup' that can be disabled at a low level when the division voltage 'V_d' is not higher than the threshold voltage which can turn ON the fourth and fifth transistors N12 and N13. In addition, the signal generating unit 112 can produce the power-up signal 'pwrup' that is enabled at a high level when the division voltage 'V_d' is higher than the threshold voltage of the fourth and fifth transistors N12 and N13.

When the power-up signal 'pwrup' is enabled at a high level, the pulse signal generating unit 120 can produce the pulse signal 'pulse', which is enabled for a predetermined time.

Figure 5:
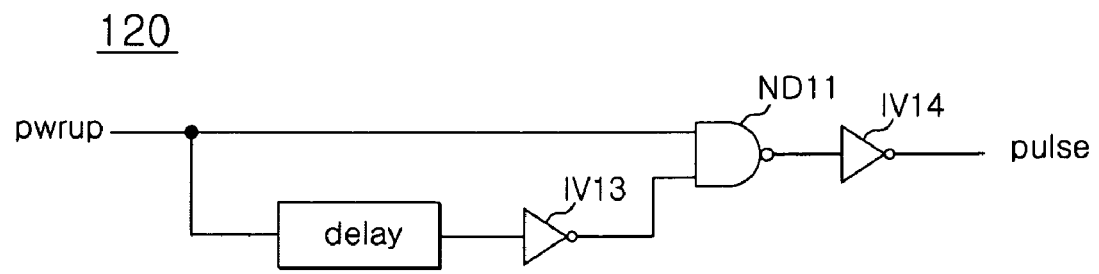
FIG. 5 is a block diagram of an exemplary a pulse generating unit capable of being implemented in the unit of FIG. 3 according to one embodiment.

FIG. 5 is a block diagram of an exemplary a pulse generating unit 120 capable of being implemented in the unit of FIG. 3 according to one embodiment. In FIG. 5, the pulse signal generating unit 120 can include third and fourth inverter IV13 and IV14, a delayer, and a NAND gate ND11. The delayer can receive the power-up signal 'pwrup', and the third inverter IV13 can receive an output signal of the delayer. The NAND gate ND11 can receive an output signal of the third inverter IV13 and the power-up signal 'pwrup'. The fourth inverter IV14 can receive an output signal of the NAND gate ND11, and then can output the pulse signal 'pulse'.

Figure 6:
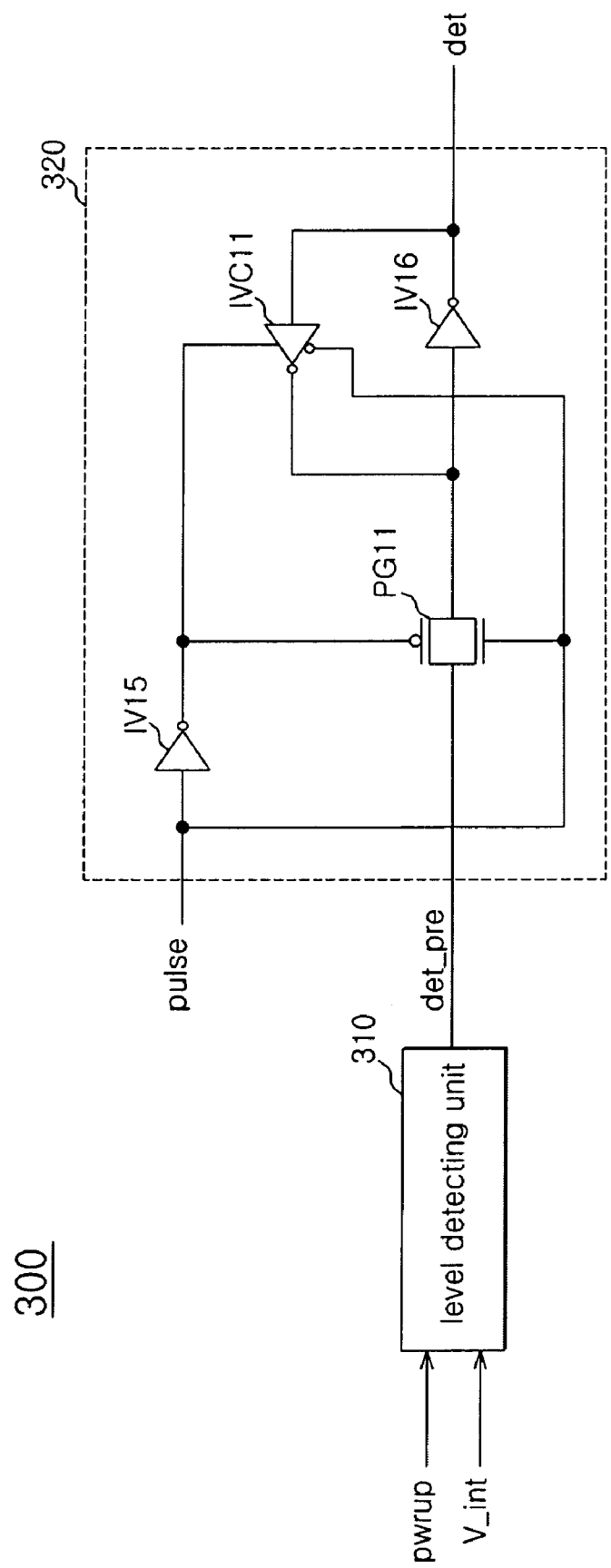
FIG. 6 is a block diagram of an exemplary detection signal generating unit capable of being implemented in the apparatus of FIG. 2 according to one embodiment.

FIG. 6 is a block diagram of an exemplary detection signal generating unit 300 capable of being implemented in the apparatus of FIG. 2 according to one embodiment. In FIG. 6, the detection signal generating unit 300 can include a level detecting unit 310 and a latch unit 320.

When the power-up signal 'pwrup' is enabled, the level detecting unit 310 can produce a pre-detection signal 'det_pre' by detecting the internal voltage 'V_int'.

The latch unit 320 can produce the detection signal 'det' by inverting the pre-detection signal 'det_pre' while the pulse signal 'pulse' is enabled. In addition, while the pulse signal 'pulse' is disabled, the latch unit 320 can maintain the voltage level of the detection signal 'det' regardless of the pre-detection signal 'det_pre'. For example, the latch unit 320 can include fifth and sixth inverters IV15 and IV16, a control inverter IVC11, and a pass gate PG11.

The fifth inverter IV15 can receive the pulse signal 'pulse'. The pass gate PG11 can receive an output signal of the fifth inverter IV15 through a first control input terminal and can receive the pulse signal 'pulse' through a second control input terminal. The pass gate PG11 can pass through the pre-detection signal 'det_pre' in response to the output signal of the fifth inverter IV15 and the pulse signal 'pulse'.

The sixth inverter IV16 can receive an output signal of the pass gate PG11 and then can output the detection signal 'det'.

In the control inverter IVC11, the output signal of the fifth inverter IV15 can be input into a first control input terminal, and the pulse signal 'pulse' can be input into a second control input terminal. An output signal of the sixth inverter IV16 can be input into an input terminal of the control inverter IVC11, and an output terminal of the control inverter IVC11 can be coupled to an input terminal of the sixth inverter IV16.

Figure 7:
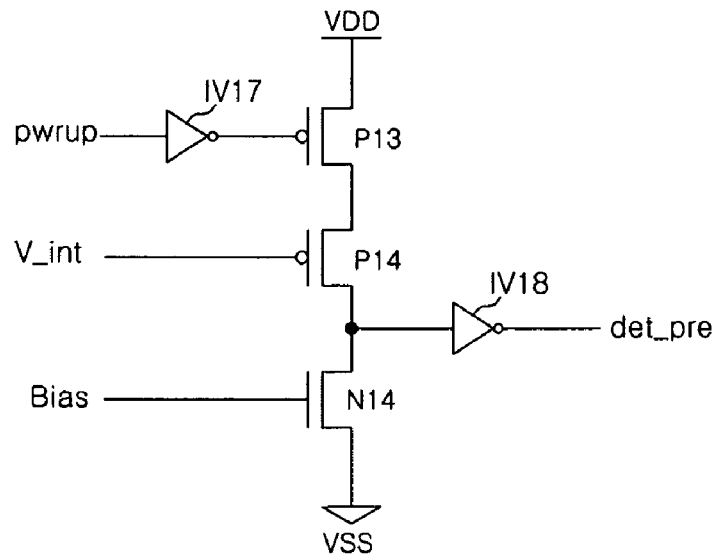
FIG. 7 is a block diagram of an exemplary level detecting unit capable of being implemented in the unit of FIG. 6 according to one embodiment.

FIG. 7 is a block diagram of an exemplary level detecting unit 310 capable of being implemented in the unit of FIG. 6 according to one embodiment. In FIG. 7, the level detecting unit 310 can include sixth to eighth transistors P13, P14 and N14, and seventh and eighth inverters IV17 and IV18.

The seventh inverter IV17 can receive the power-up signal 'pwrup'. The sixth transistor P13 can include a gate terminal receiving an output signal of the seventh inverter IV17 and a source terminal receiving the external voltage VDD. The seventh transistor P14 can include a gate terminal receiving the internal voltage V_int and a source terminal coupled to a drain terminal of the sixth transistor P13. The eighth transistor N14 can include a gate terminal receiving a bias voltage 'Bias', a drain terminal coupled to a drain terminal of the seventh transistor P14, and a source terminal coupled to the ground voltage 'VSS'. An input terminal of the eighth inverter IV18 can be coupled to a node to which the seventh and eighth transistors P14 and N14 are coupled, and the pre-detection signal 'det_pre' can be output from an output terminal of the eighth inverter IV18.

When the power-up signal 'pwrup' is enabled at a high level and the internal voltage 'V_int' has a target level, the level detecting unit 310 can enable the pre-detection signal 'det_pre' at a low level. For example, when the power-up signal 'pwrup' is at a high level, the sixth transistor P13 can be turned ON, the internal voltage 'V_int' can have a low voltage level to a degree that is sufficient to turn ON the seventh transistor P14, the external voltage 'VDD' can be supplied to the input terminal of the eighth inverter IV18, and then the pre-detection signal 'det_pre' can be enabled at a low level. When the power-up signal 'pwrup' is disabled at a low level or the internal voltage 'V_int' has a high level to a degree that is sufficient to turn OFF the seventh transistor P14, the pre-detection signal 'det_pre' can be disabled at a high level.

An exemplary operation of the semiconductor memory apparatus will be described with reference to FIGS. 2-7.

First, the external voltage 'VDD' is supplied. Accordingly, the external voltage 'VDD' increases from a ground voltage level and the power-up signal 'pwrup' is in a disable state. When the external voltage 'VDD' is greater than a specific voltage level, the power-up signal 'pwrup' is enabled.

The internal voltage generating unit 200, which executes an initial operation during the section in which the power-up signal 'pwrup' is disabled, produces the internal voltage 'V_int' having a target level when the power-up signal 'pwrup' is enabled. However, if the initial operation is not carried out sufficiently, the internal voltage generating unit 200 cannot produce the internal voltage 'V_int' having the target level even if the power-up signal 'pwrup' is enabled. This problem is caused by the internal voltage generating unit 200 wherein the power-up signal 'pwrup' is abnormally enabled faster than a normal operation because of the variation of process, voltage, and temperature (PVT) variables, whereby the external voltage 'VDD' can be enabled at a low level that is lower than a specific level.

When the power-up signal 'pwrup' is enabled, the detection signal generating unit 300 detects the voltage level of the internal voltage 'V_int' and then produces the detection signal 'det'. For example, when the power-up signal 'pwrup' is enabled, the detection signal generating unit 300 detects the voltage level of the internal voltage 'V_int', produces the pre-detection signal 'det_pre', and then outputs the detection signal 'det' by inverting the pre-detection signal 'det_pre'. However, the detection signal generating unit 300 outputs, as the detection signal 'det', the pre-detection signal 'det_pre' for a predetermined time after the power-up signal 'pwrup' is enabled and outputs the detection signal 'det' regardless of the pre-detection signal 'det_pre' after the predetermined time.

When the internal voltage 'V_int' is still not at a target level after the power-up signal 'pwrup' is enabled, the detection signal 'det' is enabled at a high level. When the detection signal 'det' is enabled at a high level, the power-up signal 'pwrup' is disabled. For example, the power-up signal 'pwrup' is configured to be enabled at a high level that is higher than the voltage level of the initially enabled external voltage 'VDD'.

The internal voltage generating unit 200 carries out the initialization operation until the external voltage 'VDD' reaches to a voltage level that is higher than the voltage level at which the power-up signal 'pwrup' is first enabled.

When the power-up signal 'pwrup' is enabled again, the internal voltage generating unit 200 can produce the internal voltage 'V_int' having the target level.

When the power-up signal is enabled at an abnormal timing that is faster than a normal timing because of the variation of the PVT variables and the internal voltage does not reach to the target level, the initialization of the internal voltage generating unit is carried out sufficiently by disabling the power-up signal and then the internal voltage generating unit generates the internal voltage having the target level by enabling the power-up signal. Accordingly, the semiconductor memory apparatus can stably produce the internal voltage and improve the reliability of the operation by guaranteeing the stable generation of the internal voltage.

Figure 8:
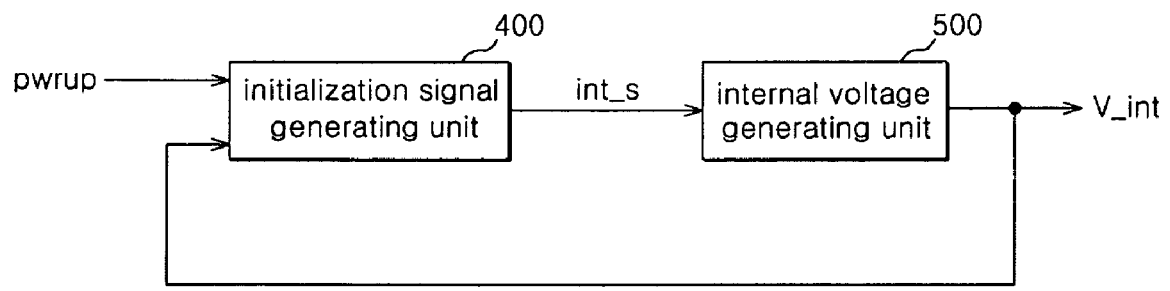
FIG. 8 is a block diagram of another exemplary semiconductor memory apparatus according to another embodiment.

FIG. 8 is a block diagram of another exemplary semiconductor memory apparatus according to another embodiment. In FIG. 8, a semiconductor memory apparatus 4 can include an initialization signal generating unit 400 and an internal voltage generating unit 500.

The initialization signal generating unit 400 can produce an initialization signal 'int_s' in response to a power-up signal 'pwrup' and an internal voltage 'V_int'. In addition, the initialization signal generating unit 400 can detect the internal voltage 'V_int' for a predetermined time, when the power-up signal 'pwrup' is enabled, and then can output a sensed signal as the initialization signal 'int_s'. Furthermore, the initialization signal generating unit 400 can output the power-up signal 'pwrup' as the initialization signal 'int_s' after the predetermined time.

The internal voltage generating unit 500 can carry out the initialization operation in response to the initialization signal 'int_s' and produces the internal voltage 'V_int'.

Figure 9:
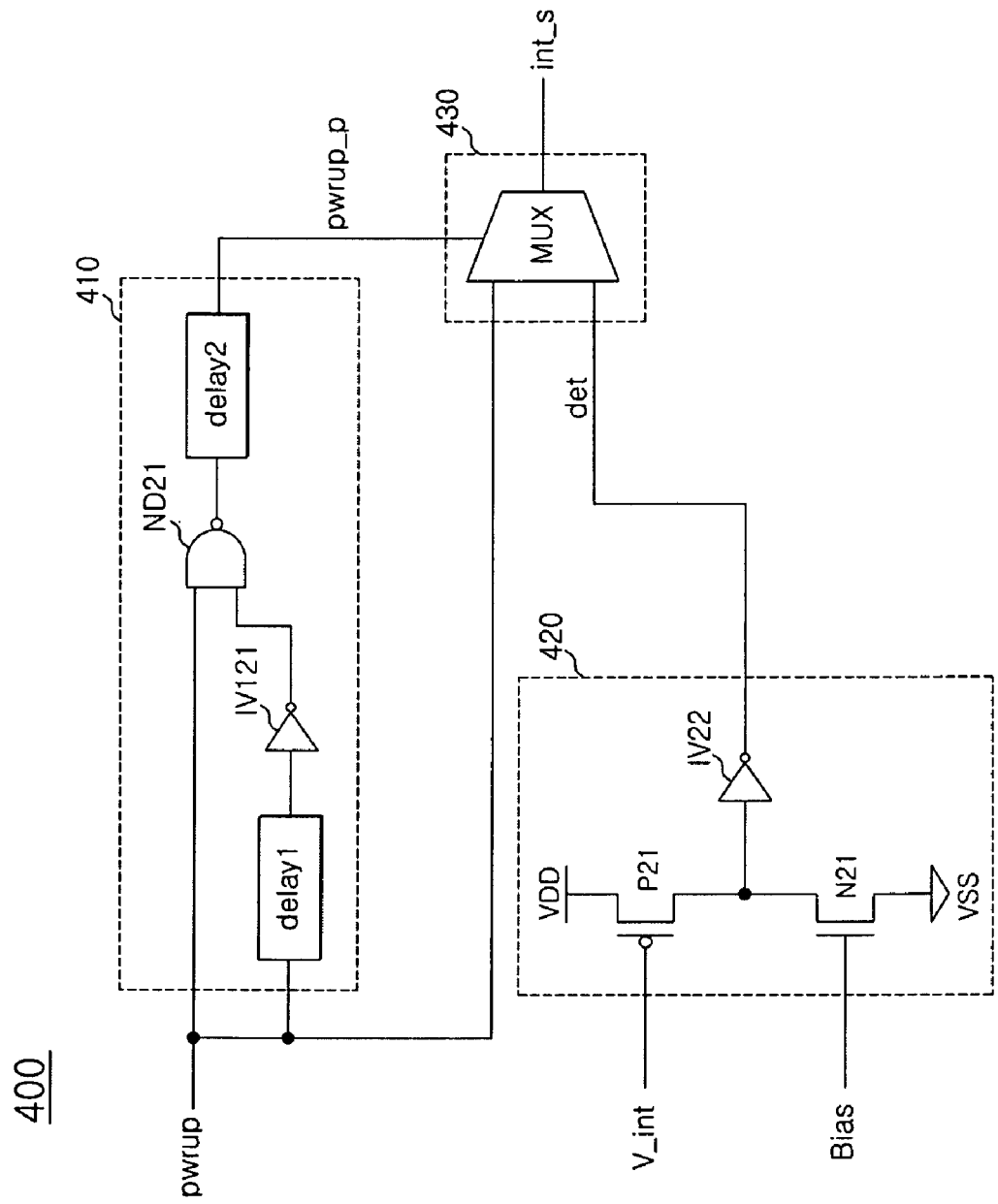
FIG. 9 is a block diagram of an exemplary initialization signal generating unit capable of being implemented in the apparatus of FIG. 8 according to one embodiment.

FIG. 9 is a block diagram of an exemplary initialization signal generating unit 400 capable of being implemented in the apparatus of FIG. 8 according to one embodiment. In FIG. 9, the initialization signal generating unit 400 can include a pulse generating unit 410, a detection signal generation unit 420, and a select unit 430.

The pulse generating unit 410 can produce a power-up pulse signal 'pwrup_p', which can be enabled at a high level, with the lapse of the predetermined time after the power-up signal 'pwrup' is enabled at a high level.

The pulse generating unit 410 can include a first inverter IV21, a NAND gate ND21, and first and second delayers delay 1 and delay 1. The first delayer delay 1 can receive the power-up signal 'pwrup', and the first inverter IV21 can receive an output signal of the first delayer delay 1. The NAND gate ND21 can receive an output signal of the first inverter IV21 and the power-up signal 'pwrup'. The second delayer delay 2, which can receive an output signal of the NAND gate ND21, can output the power-up pulse signal 'pwrup_p'.

The detection signal generation unit 420 can produce the detection signal 'det' that is enabled at a low level when the internal voltage 'V_int' is lower than the target level. In addition, the detection signal generation unit 420 can include first and second transistors P21 and N21 and a second inverter IV22. The first transistor P21 can include a gate terminal receiving the internal voltage 'V_int' and a source terminal receiving the external voltage 'VDD'. The second transistor N21 can include a gate terminal receiving a bias voltage 'Bias', a drain terminal coupled to a drain terminal of the first transistor P21, and a source terminal receiving the ground voltage 'VSS'. An input terminal of the second inverter IV22 can be coupled to a node between the first and second transistors P21 and N21, and the detection signal 'det' can be output from an output terminal of the second inverter IV22. The select unit 430 can output the initialization signal 'int_s', by selectively outputting one of the power-up signal 'pwrup' and the detection signal 'det' in response to the power-up pulse signal 'pwrup_p'. In addition, the select unit 430 can output the detection signal 'det' as the initialization signal 'int_s' when the power-up pulse signal 'pwrup_p' is enabled at a low level, and can output the power-up signal 'pwrup' as the initialization signal 'int_s' when the power-up pulse signal 'pwrup_p' is disabled at a high level. For example, the select unit 430 can include a multiplexer (MUX).

An exemplary operation of the semiconductor memory apparatus 4 will be described in detail with reference to FIGS. 8 and 9.

When the power-up signal 'pwrup' is disabled at a low level, the initialization signal generating unit 400 outputs the power-up signal 'pwrup' as the initialization signal 'int_s'. For example, the initialization signal 'int_s' is disabled at a low level. When the initialization signal 'int_s' is disabled at a low level, the internal voltage generating unit 500 executes the initialization operation.

Although the power-up signal 'pwrup' is enabled at a high level, the power-up signal 'pwrup' is output as the initialization signal 'int_s' after the delay time of the second delayer delay 2. For example, if the power-up signal 'pwrup' is enabled at a high level, then the initialization signal 'int_s' is also enabled at a high level.

If the initialization signal 'int_s' is enabled at a high level, then the internal voltage generating unit 500 produces the internal voltage 'V_int'. If the internal voltage generating unit 500 does not execute the initialization operation sufficiently, then the internal voltage 'V_int' does not reach to the target level. When the internal voltage 'V_int' does not reach to the target level, the detection signal generation unit 420 produces the detection signal 'det' which is enabled at a low level.

When the power-up signal 'pwrup' is enabled at a high level and the delay time is created by the second delayer delay 2, the power-up pulse signal 'pwrup_p', which is enabled at a low level, is produced.

In FIG. 9, the power-up pulse signal 'pwrup_p' is maintained at a low level for the delay time of the first delayer delay 1. The detection signal 'det' is output as the initialization signal 'int_s' while the power-up pulse signal 'pwrup_p' is at a low level. If the detection signal 'det' is disabled at a low level, then the initialization signal 'int_s' is disabled at a low level. Accordingly, the initialization signal 'int_s' is maintained at a low level for the delay time of the first delayer delay 1.

The internal voltage generating unit 500 carries out the initialization operation during the low level section of the initialization signal 'int_s'. When the power-up pulse signal 'pwrup_p' is at a high level again, the selection unit 430 outputs the power-up signal 'pwrup' as the initialization signal 'int_s'. Thus, when the power-up pulse signal 'pwrup_p' is at a high level, the initialization signal 'int_s' is enabled at a high level. The internal voltage generating unit 500 produces the internal voltage 'V_int' again when the initialization signal 'int_s' is enabled at a high level.

Accordingly, the semiconductor memory apparatus can be configured to produce the internal voltage having a target level by carrying out again the initialization operation of the internal voltage generating unit when the power-up signal is enabled at an abnormal timing which is faster than a normal timing because of the variation of the PVT so that the internal voltage does not reach to the target level. Accordingly, the semiconductor memory apparatus can obtain the stable operation in the internal voltage and can improve the reliability of the device.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor memory apparatus, comprising:
   an initialization signal generating unit configured to enable a power-up signal when an external voltage reaches a first voltage level, and to enable the power-up signal when the external voltage reaches a second voltage level higher than the first voltage level in response to a detection signal;
   an internal voltage generating unit configured to be initialized in response to the power-up signal and to produce an internal voltage using the external voltage which is a voltage source for generating the internal voltage; and
   a detection signal generating unit configured to enable the detection signal when a pulse signal generated by the power-up signal is enabled and the internal voltage is lower than a target level.

2. The semiconductor memory apparatus of claim 1, wherein the initialization signal generating unit enables the power-up signal when the detection signal is disabled and a voltage level of the external voltage is greater than the first voltage level.

3. The semiconductor memory apparatus of claim 2, wherein the initialization signal generating unit enables the power-up signal when the detection signal is enabled and the voltage level of the external voltage is greater than the second voltage level.

4. The semiconductor memory apparatus of claim 3, wherein the initialization signal generating unit disables the power-up signal when the detection signal is disabled and the external voltage is lower than the first voltage level.

5. The semiconductor memory apparatus of claim 4, wherein the initialization signal generating unit disables the power-up signal when the detection signal is enabled and the external voltage is lower than the second voltage level.

6. The semiconductor memory apparatus of claim 5, wherein initialization signal generating unit includes:
 a variable voltage dividing unit configured to generate a division voltage by dividing the external voltage according to a voltage division rate, the voltage division rate is varied in response to the detection signal; and
 a signal generating unit configured to enable the power-up signal when the division voltage is higher than a specific voltage level.

7. The semiconductor memory apparatus of claim 6, wherein the variable voltage dividing unit includes a plurality of resistors which are in series coupled to each other.

8. The semiconductor memory apparatus of claim 6, wherein at least one of the plurality of resistors is a variable resistor that varies in resistance value in response to the detection signal.

9. The semiconductor memory apparatus of claim 8, wherein the detection signal generating unit produces the detection signal by detecting a voltage level of the internal voltage while the pulse signal is enabled.

10. The semiconductor memory apparatus of claim 3, wherein the initialization signal generating unit includes a pulse signal generating unit configured to generate the pulse signal when the power-up signal is enabled.

11. The semiconductor memory apparatus of claim 1, wherein the detection signal generating unit produces the detection signal by detecting a voltage level of the internal voltage for a predetermined time when the power-up signal is enabled.

12. The semiconductor memory apparatus of claim 11, wherein the detection signal generating unit enables the detection signal when the internal voltage is lower than a target level.

13. A semiconductor memory apparatus, comprising:
 an initialization signal generating unit configured to generate a division voltage by dividing an external voltage, generate a power-up signal in response to the division voltage, and vary a voltage level of the division voltage in response to a detection signal;
 an internal voltage generating unit configured to generate the internal voltage when the power-up signal is enabled, and stop generating the internal voltage when the power signal is disabled, wherein the internal voltage generating unit generates the internal voltage using the external voltage which is a voltage source for generating the internal voltage; and
 a detection signal generating unit configured to enable the detection signal when a pulse signal generated by the power-up signal is enabled and the internal voltage is lower than a target level.

14. The semiconductor memory apparatus of claim 13, wherein the initialization signal generating unit includes:
 a variable voltage dividing unit configured to generate the division voltage by dividing the external voltage according to a voltage division rate, the voltage division rate being varied in response to the detection signal; and
 a signal generating unit configured to enable the power-up signal when the division voltage is higher than a predetermined voltage level.

* * * * *